(12) United States Patent
Lee et al.

(10) Patent No.: US 9,385,345 B2
(45) Date of Patent: Jul. 5, 2016

(54) ORGANIC LIGHT EMITTING DISPLAY DEVICE AND METHOD OF FABRICATING THE SAME

(71) Applicant: LG Display Co., Ltd., Seoul (KR)

(72) Inventors: Heui-Dong Lee, Paju-si (KR); Kwan-Soo Kim, Paju-si (KR); Dae-Gwon Song, Goyang-si (KR); Jin-Ho Park, Paju-si (KR); Sung-Ji Yoon, Paju-si (KR); Dong-Hyeok Lim, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/134,119

(22) Filed: Dec. 19, 2013

(65) Prior Publication Data

US 2014/0183493 A1 Jul. 3, 2014

(30) Foreign Application Priority Data

Dec. 28, 2012 (KR) .......................... 10-2012-0157157

(51) Int. Cl.
*H01L 51/00* (2006.01)
*H01L 51/56* (2006.01)
(Continued)

(52) U.S. Cl.
CPC .............. *H01L 51/56* (2013.01); *H01L 51/506* (2013.01); *H01L 51/5064* (2013.01); *H01L 27/3211* (2013.01)

(58) Field of Classification Search
CPC .............. H01L 51/5052; H01L 51/506; H01L 51/5064; H01L 51/5068; H01L 27/3211
USPC ............................................... 257/40
See application file for complete search history.

(56) References Cited

U.S. PATENT DOCUMENTS

2005/0173700 A1* 8/2005 Liao ..................... H01L 27/3211
257/40
2008/0116793 A1 5/2008 Lee et al.
(Continued)

FOREIGN PATENT DOCUMENTS

| CN | 102024844 A | 4/2011 |
| CN | 102569676 | 7/2012 |

(Continued)

OTHER PUBLICATIONS

Office Action for Taiwanese Patent Application No. TW 102146428, Oct. 1, 2015, 13 Pages.
(Continued)

*Primary Examiner* — John C Ingham
*Assistant Examiner* — Frederick B Hargrove
(74) *Attorney, Agent, or Firm* — Fenwick & West LLP

(57) ABSTRACT

Disclosed herein are an organic light emitting display device includes first to third sub-pixels realizing different colors, wherein each of the first to third sub-pixels includes first and second electrodes disposed on a substrate so as to face each other, an emission layer formed between the first and second electrodes, a multi-layered hole transporting layer formed between the first electrode and the emission layer to be in contact with the first electrode and the emission layer, and an electron transporting layer formed between the second electrode and the emission layer, wherein multi-layered hole transporting layer of at least one of the first to third sub-pixels includes an at least two-layered first hole transporting layer formed of a hole host and a p-type dopant having a doping concentration of 1 to 10% and a second hole transporting layer formed of the hole host.

19 Claims, 18 Drawing Sheets

(51) Int. Cl.
*H01L 51/50* (2006.01)
*H01L 27/32* (2006.01)

(56) References Cited

U.S. PATENT DOCUMENTS

| | | |
|---|---|---|
| 2009/0072720 A1* | 3/2009 | Lee et al. ................ 313/504 |
| 2010/0133994 A1 | 6/2010 | Song et al. |
| 2011/0037056 A1* | 2/2011 | Dubois et al. ............ 257/40 |
| 2011/0297977 A1* | 12/2011 | Kajimoto ................ 257/89 |
| 2012/0164772 A1* | 6/2012 | Lee ........................ 438/34 |
| 2012/0235178 A1 | 9/2012 | Mori |
| 2013/0043498 A1* | 2/2013 | Pyo et al. ................ 257/89 |

FOREIGN PATENT DOCUMENTS

| | | |
|---|---|---|
| TW | I264459 | 10/2006 |
| TW | 200824497 A | 6/2008 |
| TW | I372578 A | 9/2012 |

OTHER PUBLICATIONS

Office Action for Chinese Patent Application No. CN 201310727093.3, Feb. 1, 2016, 16 Pages.

* cited by examiner

ORGANIC LIGHT EMITTING DISPLAY DEVICE AND METHOD OF FABRICATING THE SAME

This application claims the benefit of Korean Patent Application No. 10-2012-0157157, filed on Dec. 28, 2012, which is hereby incorporated by reference in its entirety.

BACKGROUND

1. Technical Field

The present disclosure relates to an organic light emitting display device with reduced power consumption and improved efficiency and lifespan and a method of fabricating the same.

2. Discussion of the Related Art

In line with recent information era, display field, which visually displays electrical information signals, has rapidly developed. To meet such development, various flat panel display devices with excellent performance, such as ultra-thin in thickness, lightweight, and low power consumption, have been developed.

Examples of flat panel display devices include, without being limited to, a liquid crystal display (LCD) device, a plasma display panel (PDP) device, a field emission display (FED) device, and an organic light emitting device (OLED).

In particular, OLEDs, which are self-emissive devices, have faster response time, higher luminous efficiency, higher luminance and wider viewing angles than other flat panel display devices.

An organic light emitting display device includes a subpixel having an anode and a cathode opposite to each other in a state in which an emission layer is disposed between the anode and the cathode. Holes injected from the anode and electrons injected from the cathode are re-coupled with each other in the emission layer to form excitons, which are hole-electron pairs. When the excitons return to a ground state, the excitons generate energy, by which light is emitted.

In a conventional organic light emitting display device, trap energy is increased due to a gap at an interface between an anode and a hole injection layer. The increase of the trap energy raises a hole injection barrier. For this reason, it is not possible to stably supply holes to an emission layer. As a result, power consumption of the device is increased and efficiency and lifespan of the device are reduced.

SUMMARY

Accordingly, the present disclosure is directed to an organic light emitting display device and a method of fabricating the same that substantially obviate one or more problems due to limitations and disadvantages of the related art.

An object of the present disclosure is to provide an organic light emitting display device with reduced power consumption and improved efficiency and lifespan and a method of fabricating the same.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, an organic light emitting display device includes first to third sub-pixels realizing different colors, wherein each of the first to third sub-pixels includes first and second electrodes on a substrate to face each other, an emission layer formed between the first and second electrodes, a multi-layered hole transporting layer formed between the first electrode and the emission layer to be in contact with the first electrode and the emission layer, and an electron transporting layer formed between the second electrode and the emission layer, and the multi-layered hole transporting layer of at least one of the first to third sub-pixels includes an at least two-layered first hole transporting layer formed of a hole host and a p-type dopant having a doping concentration of 1 to 10% and a second hole transporting layer formed of the hole host.

The first sub-pixel may be a red sub-pixel realizing red through a red emission layer, the second sub-pixel may be a green sub-pixel realizing green through a green emission layer, and the third sub-pixel may be a blue sub-pixel realizing blue through a blue emission layer, the hole transporting layer of each of the red and green sub-pixels may include a common hole transporting layer formed by sequentially stacking the first and second hole transporting layers and an optical adjustment layer formed between the common hole transporting layer and the first electrode, and the hole transporting layer of the blue sub-pixel may include a common hole transporting layer formed by sequentially stacking the first and second hole transporting layers.

The red, green, and blue sub-pixels may in common include blue emission layers, the blue emission layer of the red sub-pixel may be formed between the red emission layer and the electron transporting layer, and the blue emission layer of the green sub-pixel may be formed between the green emission layer and the electron transporting layer.

The optical adjustment layer may include first and second optical adjustment layers sequentially formed between the first electrode and the common hole transporting layer, the first optical adjustment layer may be formed of a hole host and a p-type dopant identical to or different from that of the first hole transporting layer, and the second optical adjustment layer may be formed of a hole host identical to or different from that of the second hole transporting layer.

The optical adjustment layer may include a first optical adjustment layer formed between the first electrode and the common hole transporting layer and the first optical adjustment layer may be formed of a hole host and a p-type dopant identical to or different from that of the first hole transporting layer.

The first optical adjustment layer of the red sub-pixel may have a larger thickness than the first optical adjustment layer of the green sub-pixel.

The p-type dopant may be formed of F4-TCNQ, 1,4-TCAQ, 6,3-TCPQ, TCAQ, TCNTHPQ, or TCNPQ and the hole host may be formed of NPB, PPD, TPAC, BFA-1T, or TBDB.

The p-type dopant may have a lowest unoccupied molecular orbital (LUMO) level less than that of the hole host.

The optical adjustment layer and the first hole transporting layer including the p-type dopant may occupy 10 to 25% the multi-layered hole transporting layer.

In another aspect of the present disclosure, a method of fabricating an organic light emitting display device including first to third sub-pixels realizing different colors includes forming first electrodes of the first to third sub-pixels on a substrate, forming multi-layered hole transporting layers on the first electrodes, forming emission layers on the hole transporting layers, forming electron transporting layers on the emission layers, and forming second electrodes on the electron transporting layers, wherein the multi-layered hole transporting layer of at least one of the first to third sub-pixels includes an at least two-layered first hole transporting layer formed of a hole host and a p-type dopant having a doping concentration of 1 to 10% and a second hole transporting layer formed of the hole host.

The first sub-pixel may be a red sub-pixel realizing red through a red emission layer, the second sub-pixel may be a green sub-pixel realizing green through a green emission layer, and the third sub-pixel may be a blue sub-pixel realizing blue through a blue emission layer, the step of forming the hole transporting layers of the red, green, and blue sub-pixels may include forming optical adjustment layers on the first electrodes of the red and green sub-pixels and forming common hole transporting layers each comprising the first and second hole transporting layers at the red, green, and blue sub-pixels, and at least one of optical adjustment layers, first hole transporting layers, and second hole transporting layers may be formed by scanning or deposition using a shutter.

It is to be understood that both the foregoing general description and the following detailed description of are exemplary and explanatory and are intended to provide further explanation of the claims.

BRIEF DESCRIPTION OF THE DRAWINGS

The accompanying drawings, which are included to provide a further understanding of the present disclosure and are incorporated in and constitute a part of this application, illustrate embodiment(s) and together with the description serve to explain the principle of the present disclosure. In the drawings.

DETAILED DESCRIPTION

Reference will now be made in detail to the embodiments, examples of which are illustrated in the accompanying drawings. Wherever possible, the same reference numbers will be used throughout the drawings to refer to the same or like parts.

Figure 1:
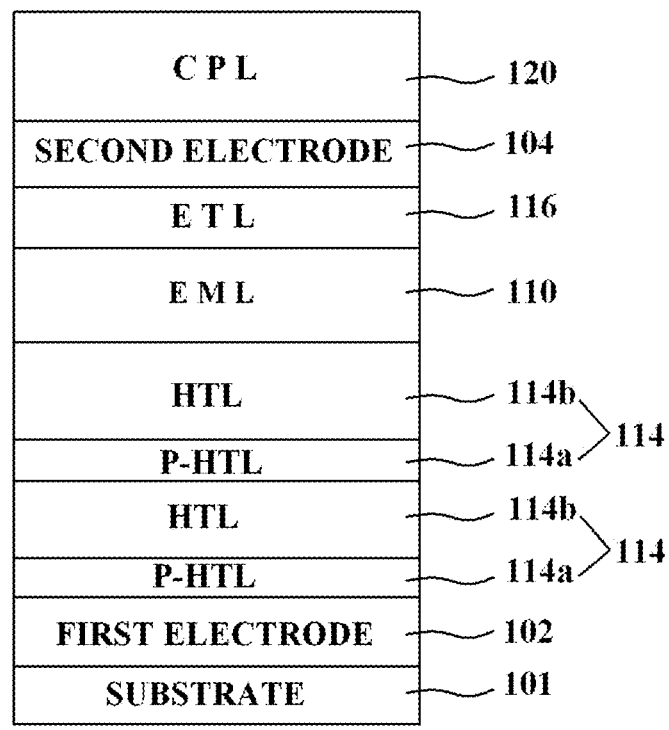
FIG. 1 is a sectional view showing an organic light emitting display device according to a first embodiment.
Figure 2:
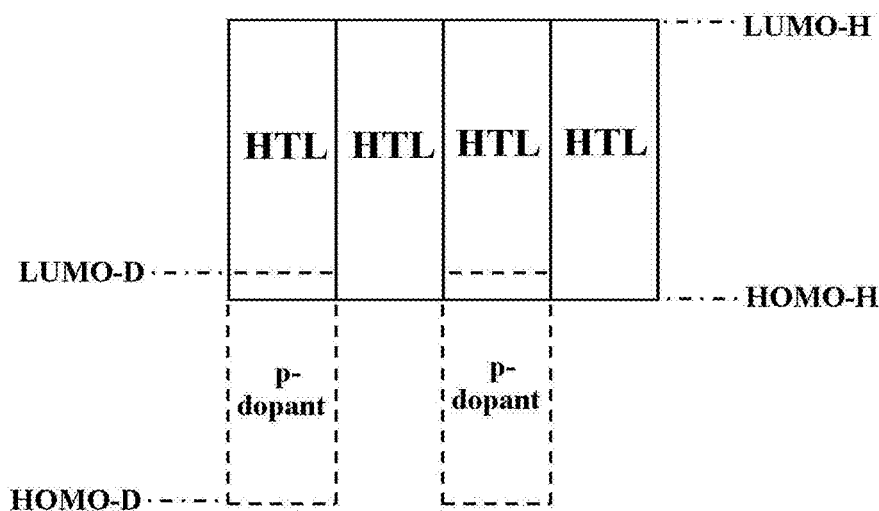
FIG. 2 is a view illustrating a relationship between a hole host and a p-type dopant shown in FIG. 1.

FIG. 1 is a sectional view showing an organic light emitting display device according to the present disclosure.

The organic light emitting display device shown in FIG. 1 includes a first electrode 102, a multi-layered hole transporting layer 114, an emission layer 110, an electron transporting layer 116, a second electrode 104, and a capping layer 120.

Any one of the first and second electrodes 102 and 104 is formed of a semi-transparent electrode and the other of the first and second electrodes 102 and 104 is formed of a reflective electrode. In a case in which the first electrode 102 is a semi-transparent electrode and the second electrode 104 is a reflective electrode, the organic light emitting display device is configured to have a rear light emitting structure in which light is emitted downward. In a case in which the second electrode 104 is a semi-transparent electrode and the first electrode 102 is a reflective electrode, the organic light emitting display device is configured to have a front light emitting structure in which light is emitted upward. In the present disclosure, the first electrode 102, as an anode, formed of a reflective electrode and the second electrode 104, as a cathode, formed of a semi-transparent electrode will be described by way of example.

The first electrode 102 is configured to have a multi-layered structure including a metal layer formed of aluminum (Al) or an aluminum alloy, such as AlNd, and a transparent layer formed of indium tin oxide (ITO) or indium zinc oxide (IZO). The first electrode 102 functions as a reflective electrode.

The second electrode 104 is configured to have a single-layered structure or a multi-layered structure. Each layer constituting the second electrode 104 may be formed of a metal, an inorganic substance, a mixture of metals, a mixture of a metal and an inorganic substance, or a mixture thereof. In a case in which each layer is formed of a mixture of a metal and an inorganic substance, a volume ratio of the metal to the inorganic substance is 10:1 to 1:10. In a case in which each layer is formed of a mixture of metals, a ratio of one to the other of the metals is 10:1 to 1:10. The second electrode 104 is formed of a metal, such as Ag, Mg, Yb, Li, or Ca. The second electrode 104 is formed of an inorganic substance, $LiO_2$, CaO, LiF, or $MgF_2$. The second electrode 104 assists movement of electrons such that a large amount of electrons are supplied to the emission layer 110.

The capping layer 120 is formed of a material exhibiting a higher refractive index than an external air layer. Light transmitted through the capping layer 120 is reflected from an interface between the capping layer 120 and the external air layer and exits out through the capping layer 120 while repeatedly reflected and transmitted between the first electrode 102 and the capping layer 120. As a result, the amount of light lost due to total reflection from the interface between the capping layer 120 and the external air layer is reduced and the amount of light transmitted is increased, thereby improving light emission efficiency.

In the emission layer 110, holes supplied through the hole transporting layer 114 and electrons supplied through the electron transporting layer 116 are re-coupled to generate light.

The electron transporting layer 116 supplies electrons from the second electrode 104 to the emission layer 110.

The hole transporting layer 114 includes first hole transporting layers 114a doped with a p-type dopant and second hole transporting layers 114b not doped with a p-type dopant, which are alternately formed. The first hole transporting layers 114a doped with the p-type dopant are formed to have a two-layered structure between the first electrode 102 and the emission layer 110. FIG. 1, the first and second hole transporting layers 114a and 114b being alternately formed twice is described by way of example. However, embodiments of the present disclosure are not limited thereto.

Each first hole transporting layer 114a is formed by doping a hole host with a p-type dopant at a doping concentration of 1 to 10%. If the doping concentration of the p-type dopant is less than 1%, it is not possible to obtain device characteristics. If the doping concentration of the p-type dopant is greater than 10%, the amount of holes exceeds that of electrons. As a result, excitons are formed at an interface between the electron transporting layer 116 and the emission layer 110, not in the emission layer 110, whereby efficiency is lowered and lifespan is shortened. At this time, the hole host has a highest occupied molecular orbital (HOMO) level of 5.0 eV or more. The p-type dopant has a lowest unoccupied molecular orbital (LUMO) level less than that of the hole host. The first hole transporting layers 114a occupy 10 to 25% the entirety of the hole transporting layer 114. If the first hole transporting layers 114a occupy less than 10% the entirety of the hole transporting layer 114, it is not possible to obtain an effect superior to that of a comparative example. If the first hole transporting layers 114a occupy greater than 25% the entirety of the hole transporting layer 114, the amount of holes exceeds that of electrons. As a result, excitons are formed at the interface between the electron transporting layer 116 and the emission layer 110, not in the emission layer 110, whereby efficiency is lowered and lifespan is shortened.

Each second hole transporting layer 114b is formed of a hole host having the same material as each first hole transporting layer 114a. Consequently, each second hole transporting layer 114b has a HOMO level of 5.0 eV or more. The second hole transporting layers 114b occupy 75 to 90% the entirety of the hole transporting layer 114.

The host used in the first and second hole transporting layers 114a and 114b is formed of a material, such as NPB, PPD, TPAC, BFA-1T, or TBDB, as represented by Chemical formula 1.

[Chemical formula 1]

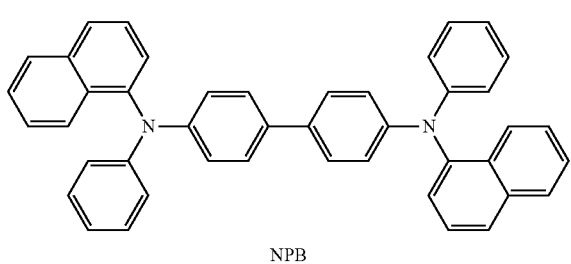

NPB

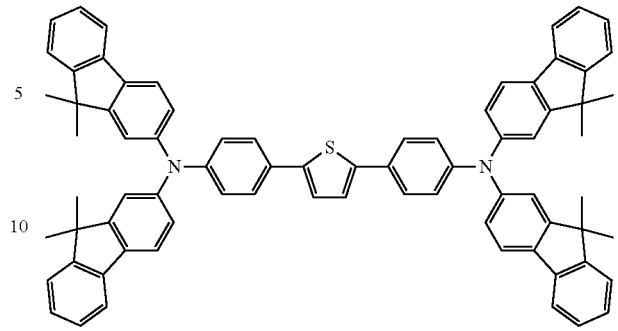

BFA-1T

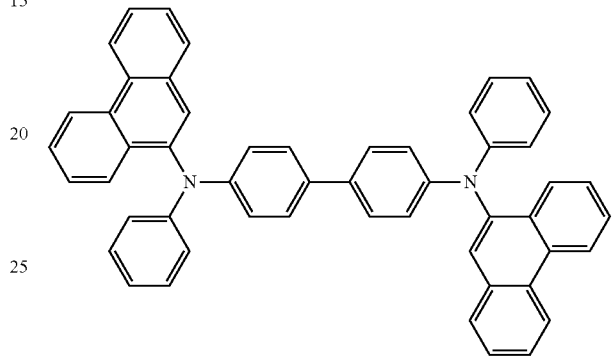

PPD

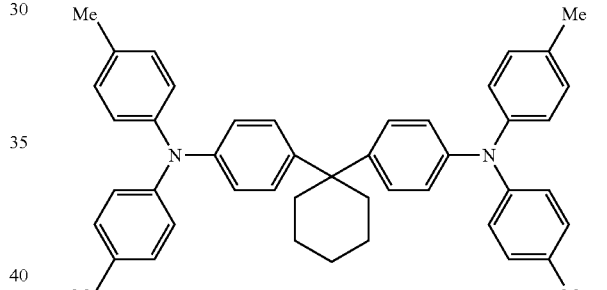

TPAC

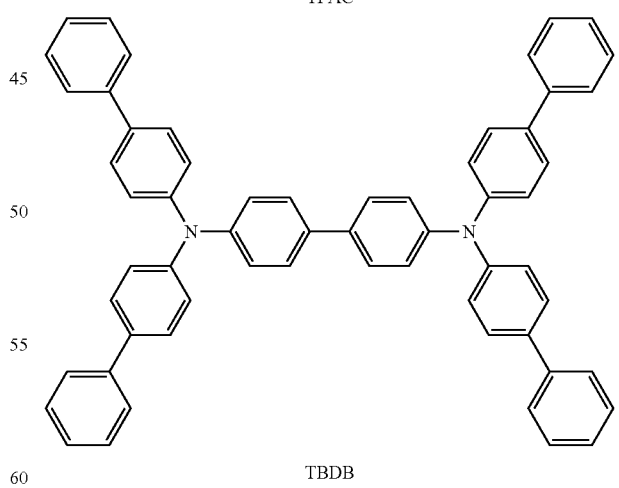

TBDB

The p-type dopant is formed of a material, such as [F4-TCNQ], [1,4-TCAQ], [6,3-TCPQ], [TCAQ], [TCNTHPQ], or [TCNPQ], as represented by Chemical formula 2.

[Chemical formula 2]

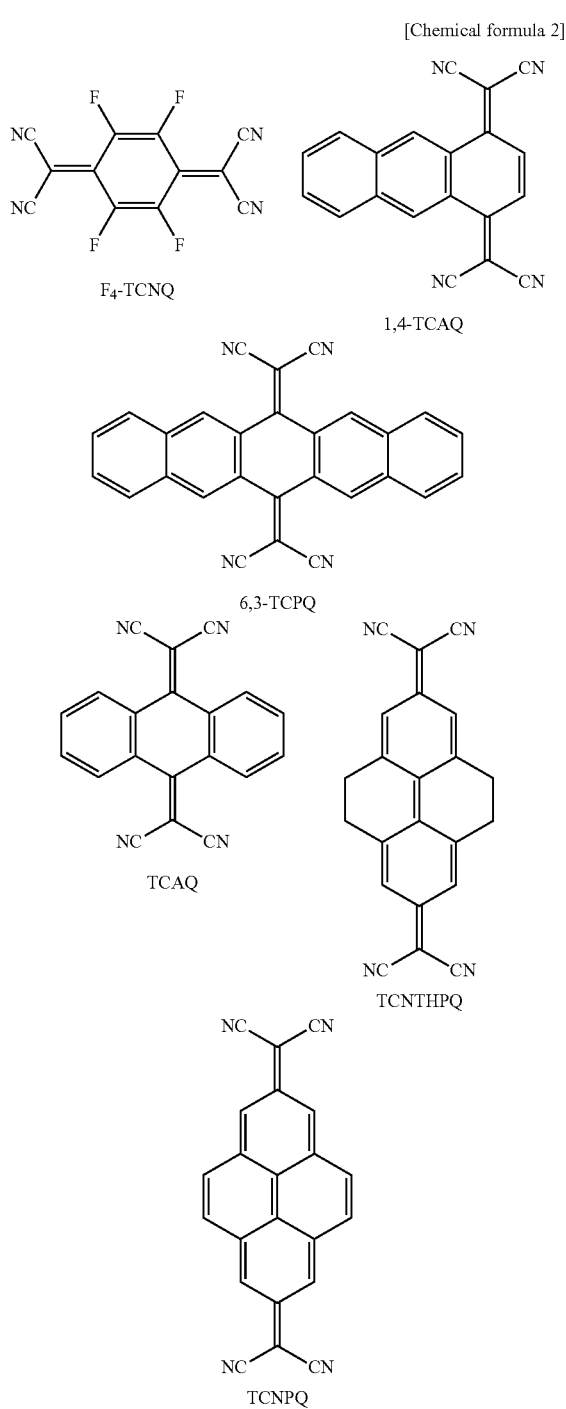

The p-type dopant doped in each first hole transporting layer 114a may fill gaps of the hole host having a laminated structure to improve stability of the interface between the first electrode 102 and the hole transporting layer 114 and to lower a hole injection barrier. Consequently, Joule heating at the interface between the first electrode 102 and the hole transporting layer 114 may be reduced. As a result, the holes may be stably supplied to the emission layer 110, thereby improving efficiency and lifespan characteristics.

Figure 3A:
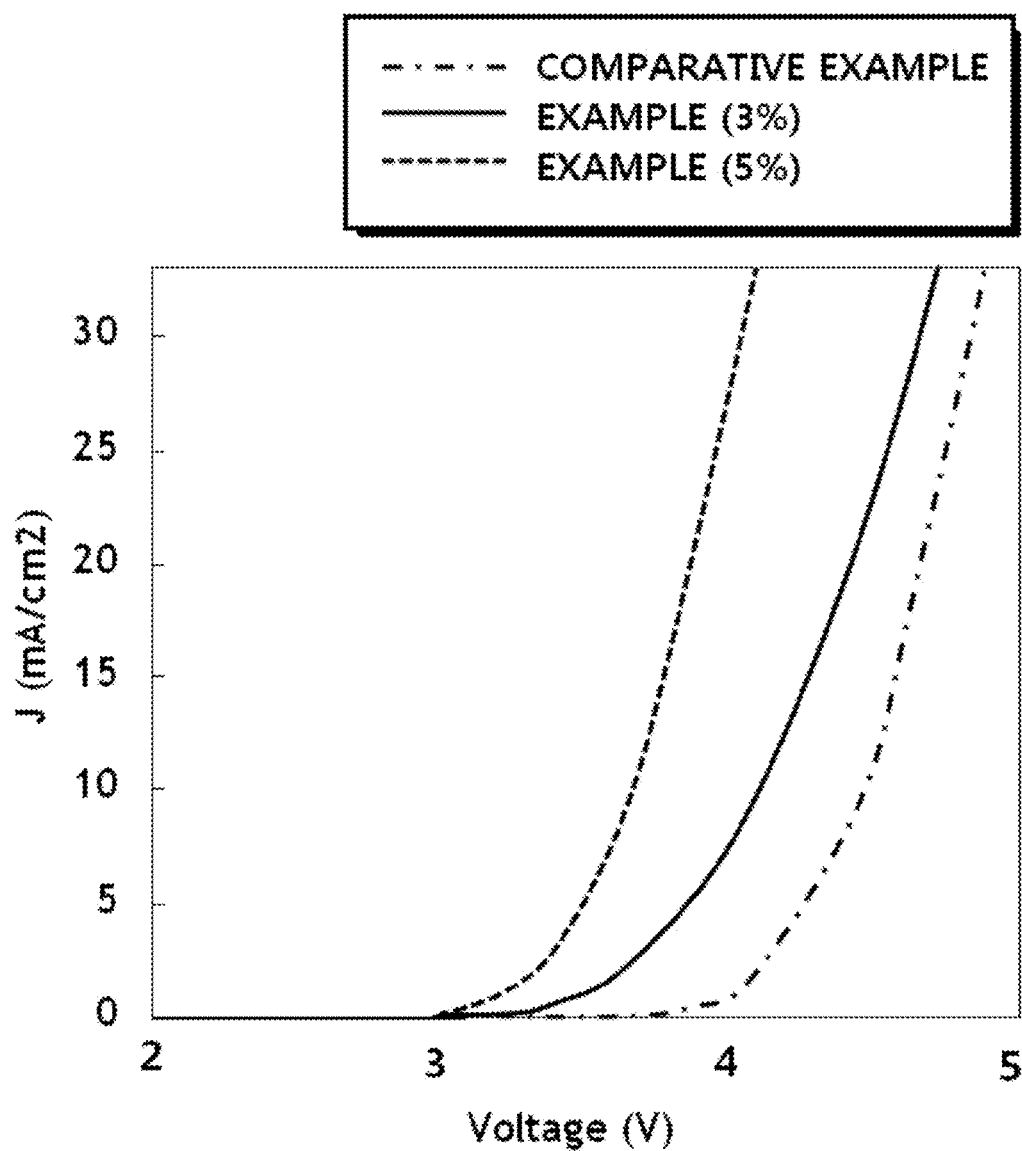
FIGS. 3A and 3B are views illustrating voltage and lifespan characteristics of the organic light emitting display device shown in FIG. 1 and a comparative example.

Specifically, as shown in FIG. 3A, it can be seen that an example in which first hole transporting layers 114a and second hole transporting layers 114b each doped with 3% of a p-type dopant are formed between a first electrode 102 and an emission layer 110 and another example in which first hole transporting layers 114a and second hole transporting layers 114b each doped with 5% of a p-type dopant are formed between a first electrode 102 and an emission layer 110 have lower driving voltage to generate the same current density than a comparative example in which a hole injection layer and a hole transporting layer are formed between a first electrode and an emission layer.

TABLE 1

|  | Efficiency (cd/A) | | | | T95 lifespan (hrs) | | | |
| --- | --- | --- | --- | --- | --- | --- | --- | --- |
|  | R | G | B | W | R | G | B | W |
| Example | 35.6 | 49.3 | 3.85 | 24.4 | 160 | 800 | 320 | 510 |
| Comparative example | 34.1 | 50.0 | 3.3 | 23.8 | 110 | 400 | 420 | 220 |

Figure 3B:
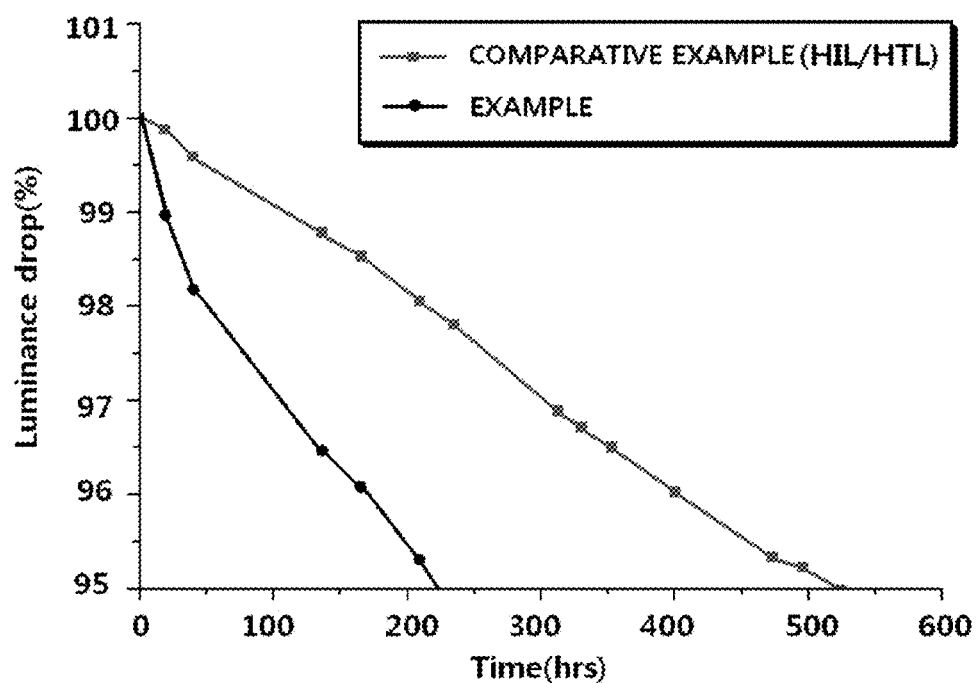

As shown in Table 1, it can be seen that the example has an efficiency characteristic equal to that of the comparative example. In addition, as shown in Table 1 and FIG. 3B, it can be seen that the example has a lifespan characteristic 100% greater than that of the comparative example. In Table 1, T95 means time until the lifespan of a white organic light emitting device reaches about 95%.

Figure 4:
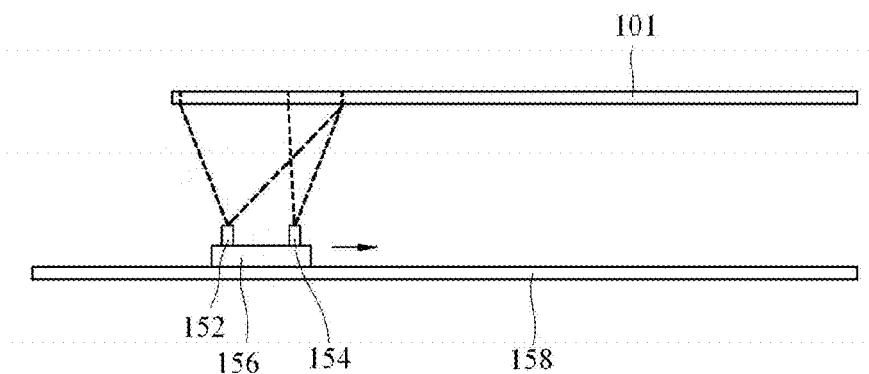
FIG. 4 is a view showing an apparatus for forming a hole transporting layer shown in FIG. 1.

The hole transporting layer 114 is formed on the first electrode 102 using a deposition apparatus shown in FIG. 4 (S22). The deposition apparatus shown in FIG. 4 includes a guide rail 158, a body 156 to perform reciprocating scan motion along the guide rail 158, and first and second deposition sources 152 and 154 provided in the body 156. The first deposition source 152 supplies a hole host to a substrate 101 and the second deposition source 154 supplies a p-type dopant to the substrate 101. At this time, supply speeds of the hole host and the p-type dopant may be changed to adjust a mixture ratio of the hole host to the p-type dopant. As the hole host from the first deposition source 152 and the p-type dopant form the second deposition source 154 are supplied to the substrate 101 as described above, a first hole transporting layer 114a constituted by the p-type dopant and the hole host is formed on the substrate. Subsequently, a second hole transporting layer 114b constituted by a hole host is formed on the first hole transporting layer 114a. Meanwhile, in a case in which the body 156 having the first and second deposition sources 152 and 154 performs reciprocating scan motion in one direction and in the opposite direction, first and second hole transporting layers 114a and 114b are alternately formed as shown in FIG. 1. The number of the first and second hole transporting layers 114a and 114b may be adjusted according to the number of times of reciprocating scan motion.

Figure 5:
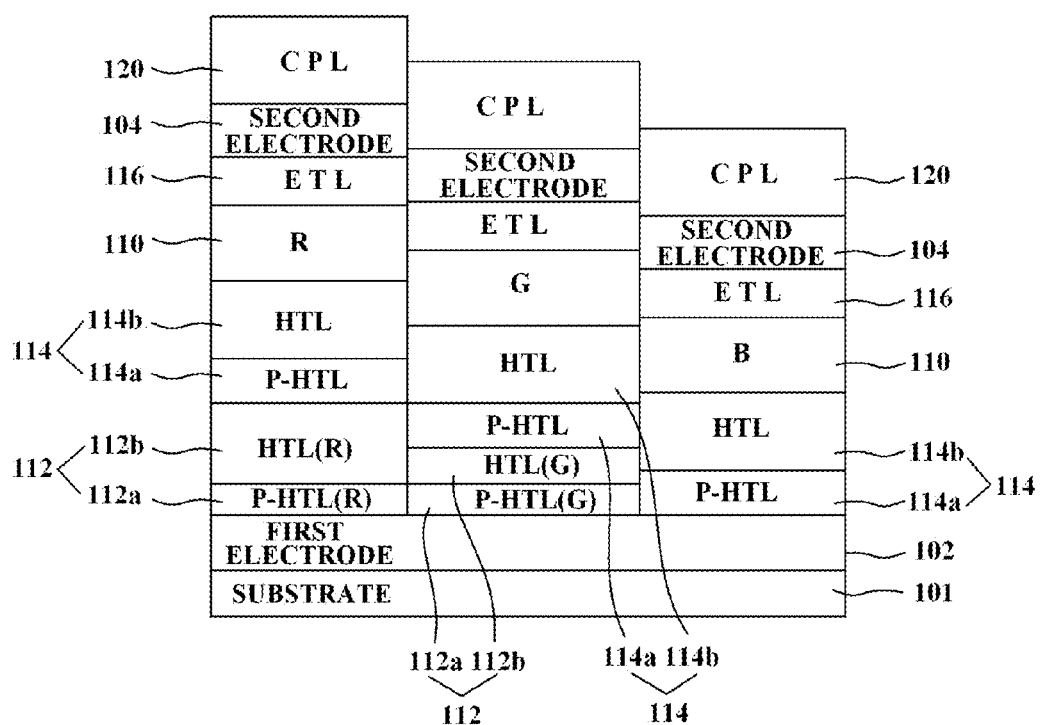
FIG. 5 is a sectional view showing an organic light emitting display device according to a second embodiment.

FIG. 5 is a sectional view showing an organic light emitting display device according to a second embodiment of the present disclosure.

The organic light emitting display device shown in FIG. 5 is identical in construction to that shown in FIG. 1 except that red, green, and blue sub-pixels have different distances between a first electrode 102 and an emission layer 110 and, therefore, a detailed description of the same components will be omitted.

The distance between the first electrode 102 and the emission layer 110 of the blue (B) sub-pixel is the smallest. The distance between the first electrode 102 and the emission layer 110 the red (R) sub-pixel is the largest. The distance between the first electrode 102 and the emission layer 110 the green (G) sub-pixel is intermediate. The respective sub-pixels constructively interfere with exit light, thereby optimizing vertical efficiency at each sub-pixel.

To this end, the red (R), green (G), and blue (B) sub-pixels each include a common hole transporting layer 114. The red (R) and green (G) sub-pixels each include an optical adjustment layer 112 formed between the common hole transporting layer 114 and the first electrode 102. In this case, the optical adjustment layer 112 of the red (R) sub-pixel has a larger thickness than the optical adjustment layer 112 of the green (G) sub-pixel.

The optical adjustment layer 112 includes first and second optical adjustment layers 112a and 112b. The common hole transporting layer 114 includes first and second hole transporting layers 114a and 114b.

The first optical adjustment layer 112a and the first hole transporting layer 114a are formed by doping a hole host with a p-type dopant at a doping concentration of 1 to 10%. At this time, the hole host has a HOMO level of 5.0 eV or more. The p-type dopant has a LUMO level less than the HOMO level of the hole host.

The second optical adjustment layer 112b and the second hole transporting layer 114b are formed of a hole host having the same material as or different materials from the first optical adjustment layer 112a and the first hole transporting layer 114a. Consequently, the second optical adjustment layer 112b and the second hole transporting layer 114b each have a HOMO level of 5.0 eV or more. The second optical adjustment layer 112b and the second hole transporting layer 114b occupy 75% to 90% the entirety of the hole transporting layer 114.

The host used in the first and second optical adjustment layers 112a and 112b and the first and second hole transporting layers 114a and 114b is formed of a material, such as NPB, PPD, TPAC, BFA-1T, or TBDB, as represented by Chemical formula 1. The same host or different hosts may be used in the first and second optical adjustment layers 112a and 112b and the host used in the first and second hole transporting layers 114a and 114b.

The p-type dopant is formed of a material, such as [F4-TCNQ], [1,4-TCAQ], [6,3-TCPQ], [TCAQ], [TCNTHPQ], or [TCNPQ], as represented by Chemical formula 2. The same p-type dopant or different p-type dopants may be used in the first optical adjustment layer 112a and the first hole transporting layer 114a. The p-type dopant used in the first optical adjustment layer 112a and the first hole transporting layer 114a may have the same doping concentration or different concentrations. In a case in which the doping concentration of the p-type dopant in the first optical adjustment layer 112a of the red sub-pixel having the largest thickness is higher than that of the p-type dopant in the first optical adjustment layer 112a of the green sub-pixel, driving voltage of the red (R) sub-pixel may be lowered, thereby reducing power consumption.

Specifically, Table 2 illustrates electro-optic characteristics of red sub-pixels of a comparative example and examples.

TABLE 2

| Structure | Volt | cd/A | lm/W | CIEx | CIEy |
| --- | --- | --- | --- | --- | --- |
| Comparative example | 4.8 | 54.1 | 35.6 | 0.665 | 0.332 |
| Example (3%) | 4.4 | 52.8 | 37.6 | 0.664 | 0.334 |
| Example (5%) | 4.3 | 54.6 | 39.9 | 0.662 | 0.331 |
| Example (7%) | 4.2 | 54.1 | 40.4 | 0.662 | 0.335 |

In Table 2, the comparative example and the examples are devices having the following stacked structures.

Figure 6A:
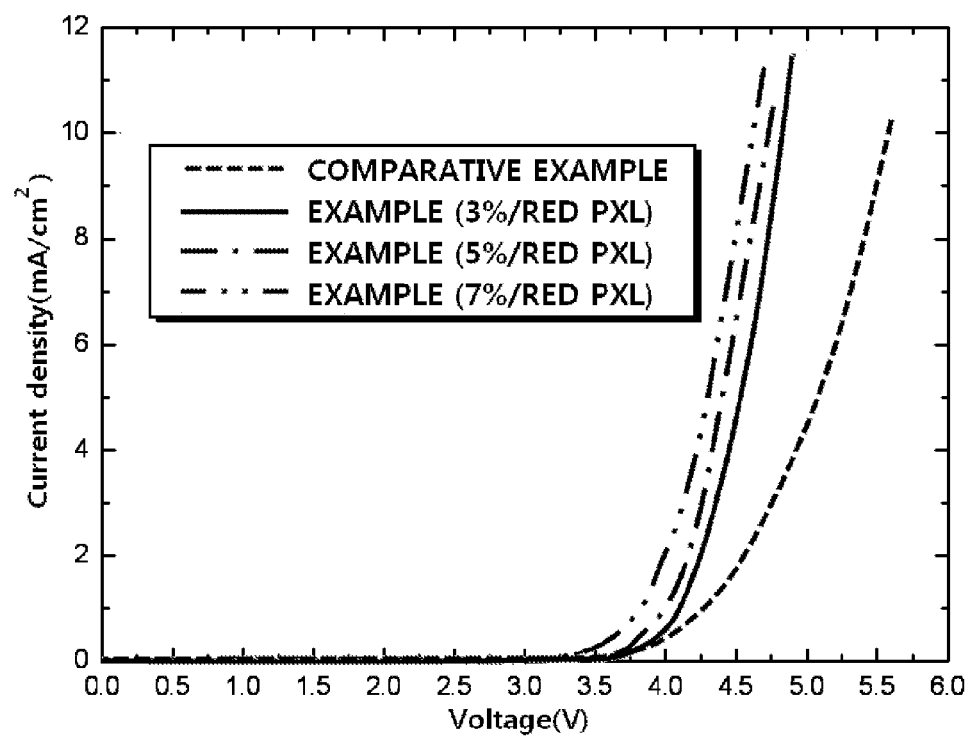
FIGS. 6A and 6B are views illustrating voltage and lifespan characteristics of a red sub-pixel of the organic light emitting display device shown in FIG. 5 and a red sub-pixel of a comparative example.
Figure 6B:
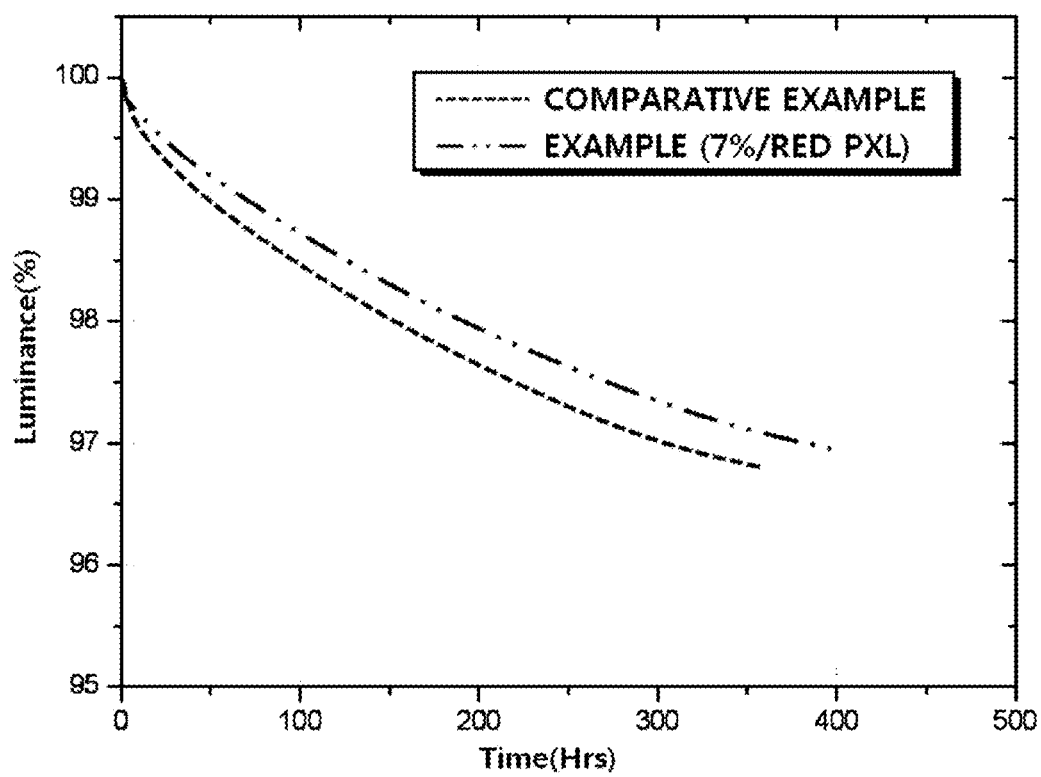

Comparative example: a hole transporting layer (100 Å) doped with a 3% p-type dopant/hole transporting layer (1900 Å)/red emission layer/electron transporting layer/second electrode/capping layer Example (3%): a first optical adjustment layer (100 Å) doped with a 3% p-type dopant/second optical adjustment layer (700 Å)/first hole transporting layer (100 Å) doped with a 3% p-type dopant/second hole transporting layer (1100 Å)/red emission layer/electron transporting layer/second electrode/capping layer Example (5%): a first optical adjustment layer (100 Å) doped with a 5% p-type dopant/second optical adjustment layer (700 Å)/first hole transporting layer (100 Å) doped with a 3% p-type dopant/second hole transporting layer (1100 Å)/red emission layer/electron transporting layer/second electrode/capping layer Example (7%): a first optical adjustment layer (100 Å) doped with a 7% p-type dopant/second optical adjustment layer (700 Å)/first hole transporting layer (100 Å) doped with a 3% p-type dopant/second hole transporting layer (1100 Å)/red emission layer/electron transporting layer/second electrode/capping layer As shown in Table 2 and FIG. 6A, it can be seen that the example in which the first optical adjustment layer 112a of the red sub-pixel is doped with the 7% p-type dopant has maximally 0.6V lower driving voltage to generate the same current density than the comparative example. In addition, as shown in FIG. 6B, it can be seen that lifespan of the example is somewhat increased.

Table 3 illustrates electro-optic characteristics of green sub-pixels of a comparative example and examples.

TABLE 3

| Structure | Volt | cd/A | lm/W | CIEx | CIEy |
| --- | --- | --- | --- | --- | --- |
| Comparative example | 4.8 | 54.1 | 35.6 | 0.665 | 0.332 |
| Example (3%) | 4.4 | 52.8 | 37.6 | 0.664 | 0.334 |
| Example (5%) | 4.3 | 54.6 | 39.9 | 0.662 | 0.331 |
| Example (7%) | 4.2 | 54.1 | 40.4 | 0.662 | 0.335 |

In Table 3, the comparative example and the examples are devices having the following stacked structures.

Figure 7A:
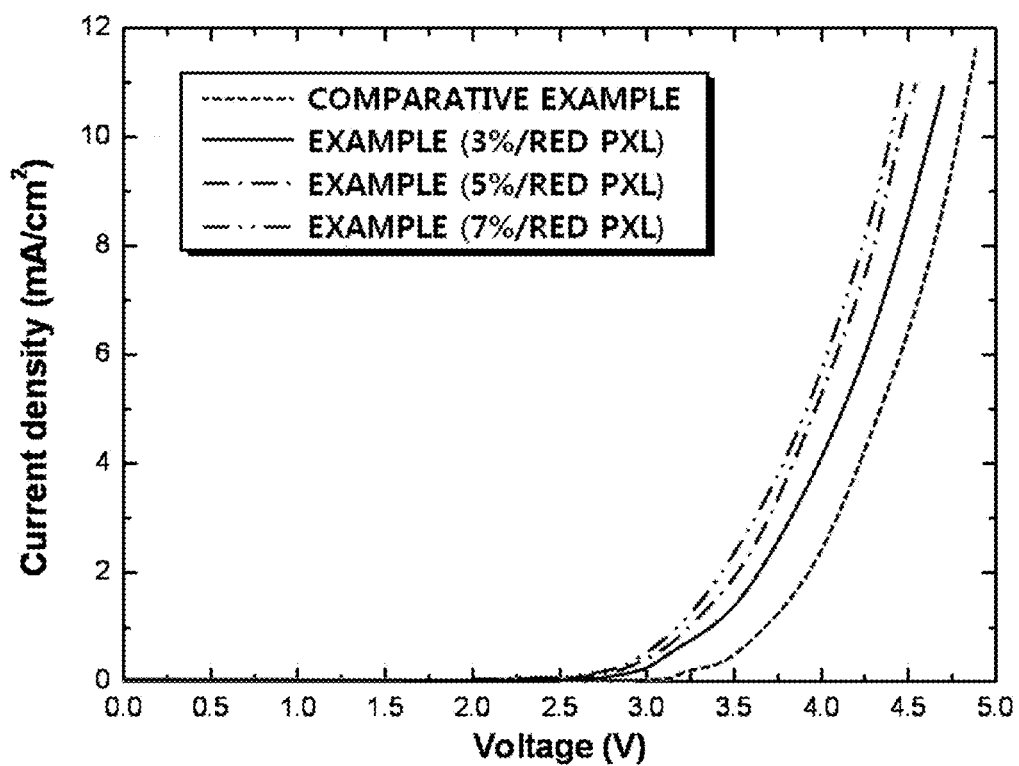
FIGS. 7A and 7B are views illustrating voltage and lifespan characteristics of a green sub-pixel of the organic light emitting display device shown in FIG. 5 and a green sub-pixel of the comparative example.
Figure 7B:
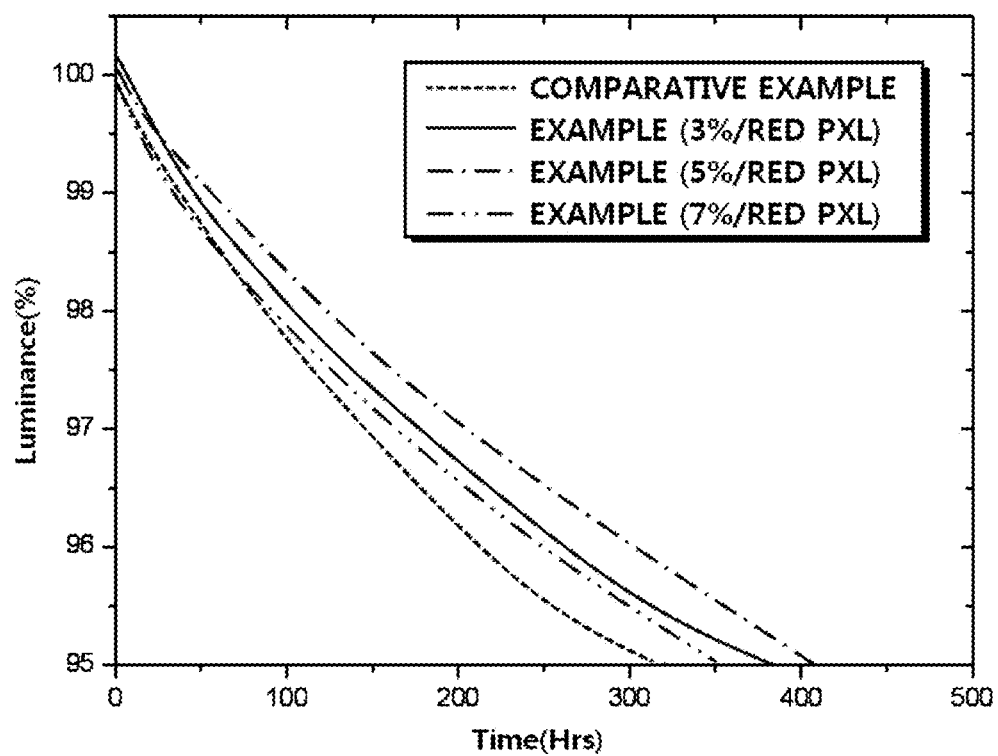

Comparative example: a hole transporting layer (100 Å) doped with a 3% p-type dopant/hole transporting layer (1900 Å)/green emission layer/electron transporting layer/second electrode/capping layer Example (3%): a first optical adjustment layer (100 Å) doped with a 3% p-type dopant/second optical adjustment layer (700 Å)/first hole transporting layer (100 Å) doped with a 3% p-type dopant/second hole transporting layer (1100 Å)/green emission layer/electron transporting layer/second electrode/capping layer Example (5%): a first optical adjustment layer (100 Å) doped with a 5% p-type dopant/second optical adjustment layer (700 Å)/first hole transporting layer (100 Å) doped with a 3% p-type dopant/second hole transporting layer (1100 Å)/green emission layer/electron transporting layer/second electrode/capping layer Example (7%): a first optical adjustment layer (100 Å) doped with a 7% p-type dopant/second optical adjustment layer (700 Å)/first hole transporting layer (100 Å) doped with a 3% p-type dopant/second hole transporting layer (1100 Å)/green emission layer/electron transporting layer/second electrode/capping layer As shown in Table 3 and FIG. 7A, it can be seen that the example in which the first optical adjustment layer 112a of the green sub-pixel is doped with the 5% p-type dopant and the example in which the first optical adjustment layer 112a of the green sub-pixel is doped with the 7% p-type dopant have maximally 0.3V lower driving voltage to generate the same current density than the comparative example. In addition, as shown in FIG. 7B, it can be seen that lifespan of each example is increased.

Figure 8:
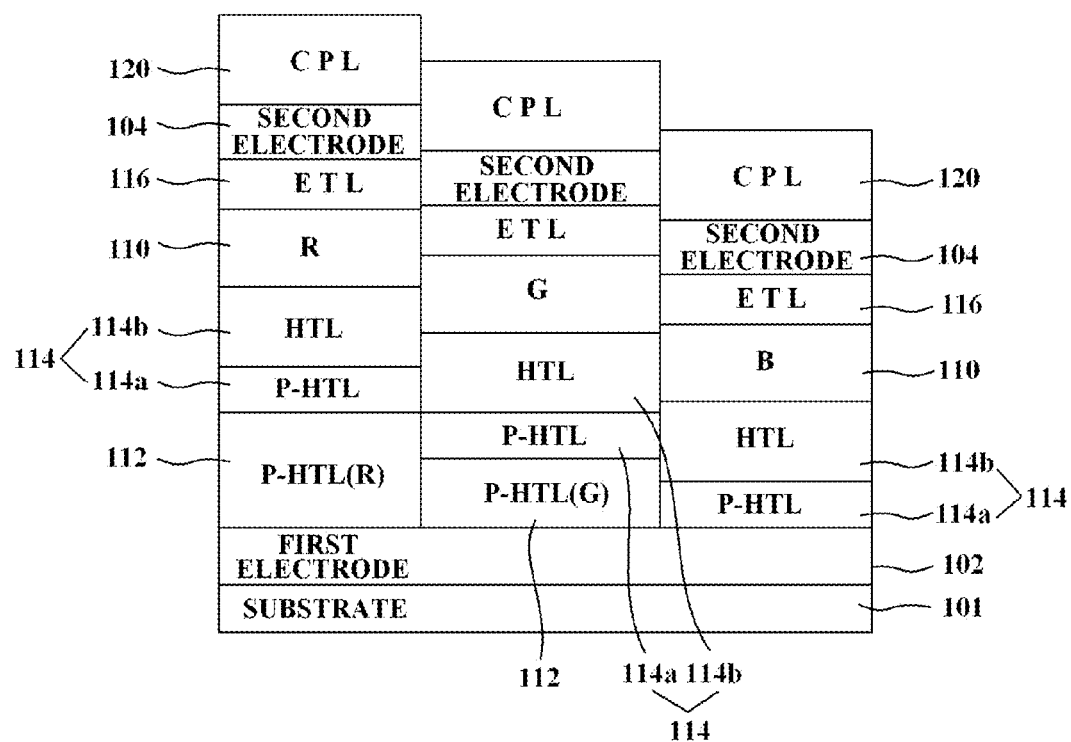
FIG. 8 is a sectional view showing an organic light emitting display device according to a third embodiment.

FIG. 8 is a sectional view showing an organic light emitting display device according to a third embodiment of the present disclosure. The organic light emitting display device shown in FIG. 8 is identical in construction to that shown in FIG. 5 except that optical adjustment layers 112 of red and green sub-pixels each include only a first optical adjustment layer and, therefore, a detailed description of the same components will be omitted.

A red (R) sub-pixel includes an optical adjustment layer 112 formed between a common hole transporting layer 114 and a first electrode 102. A green (G) sub-pixel includes an optical adjustment layer 112, having a smaller thickness than the optical adjustment layer 112 of the red R sub-pixel, formed between a common hole transporting layer 114 and a first electrode 102.

The optical adjustment layer 112 of each of the red and green sub-pixels includes only a first optical adjustment layer. The common hole transporting layer 114 is formed by sequentially stacking first and second hole transporting layers 114a and 114b.

The optical adjustment layer 112 and the first hole transporting layer 114a are formed by doping a hole host with a p-type dopant at a doping concentration of 1 to 10%. At this time, the hole host has a HOMO level of 5.0 eV or more. The p-type dopant has a LUMO level less than the HOMO level of the hole host.

The second hole transporting layer 114b is formed of a hole host having the same material as the first hole transporting layer 114a. Consequently, the second hole transporting layer 114b has a HOMO level of 5.0 eV or more.

The host used in the optical adjustment layer 112 and the first and second hole transporting layers 114a and 114b is formed of a material, such as NPB, PPD, TPAC, BFA-1T, or TBDB, as represented by Chemical formula 1. The same host or different hosts may be used in the optical adjustment layer 112 and the first and second hole transporting layers 114a and 114b.

The p-type dopant is formed of a material, such as [F4-TCNQ], [1,4-TCAQ], [6,3-TCPQ], [TCAQ], [TCNTHPQ], or [TCNPQ], as represented by Chemical formula 2. The same p-type dopant or different p-type dopants may be used in the optical adjustment layer 112 and the first hole transporting layer 114a. The p-type dopant used in the optical adjustment layer 112 and the first hole transporting layer 114a may have the same doping concentration or different concentrations. In a case in which the doping concentration of the p-type dopant in the optical adjustment layer 112 of the red sub-pixel, which is thick, is higher than that of the p-type dopant in the optical adjustment layer 112 of the green (G) sub-pixel, driving voltage of the red sub-pixel may be lowered, thereby reducing power consumption.

Figure 9:
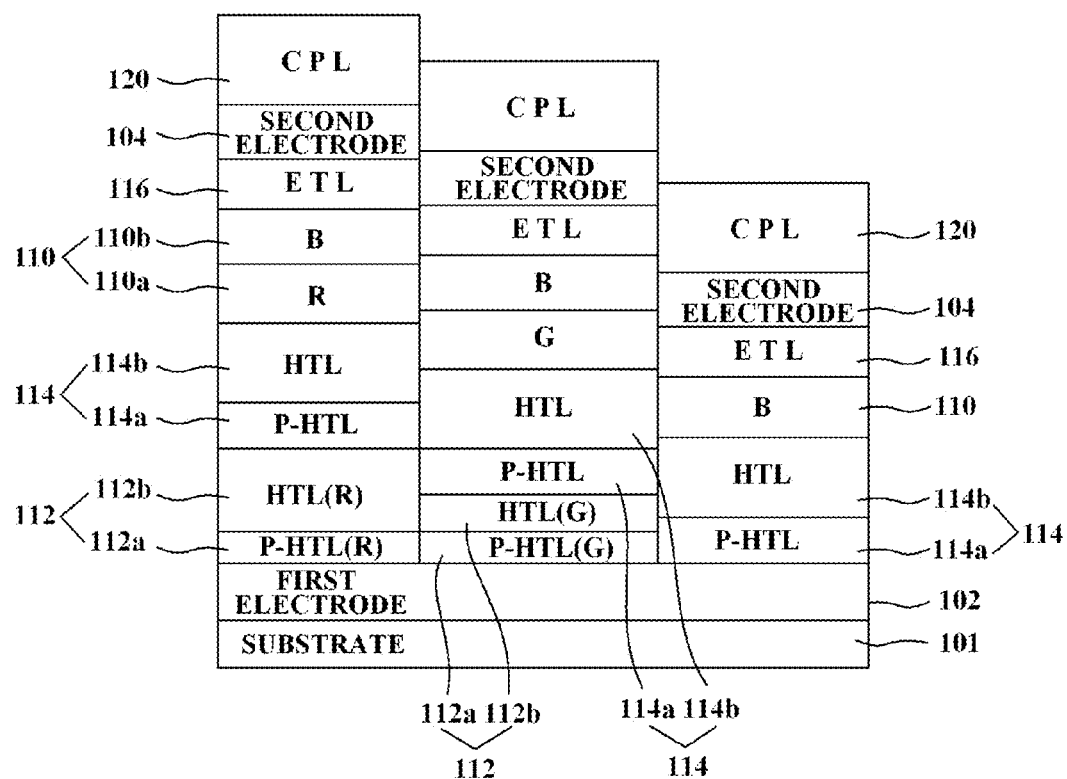
FIG. 9 is a sectional view showing an organic light emitting display device according to a fourth embodiment.
Figure 10:
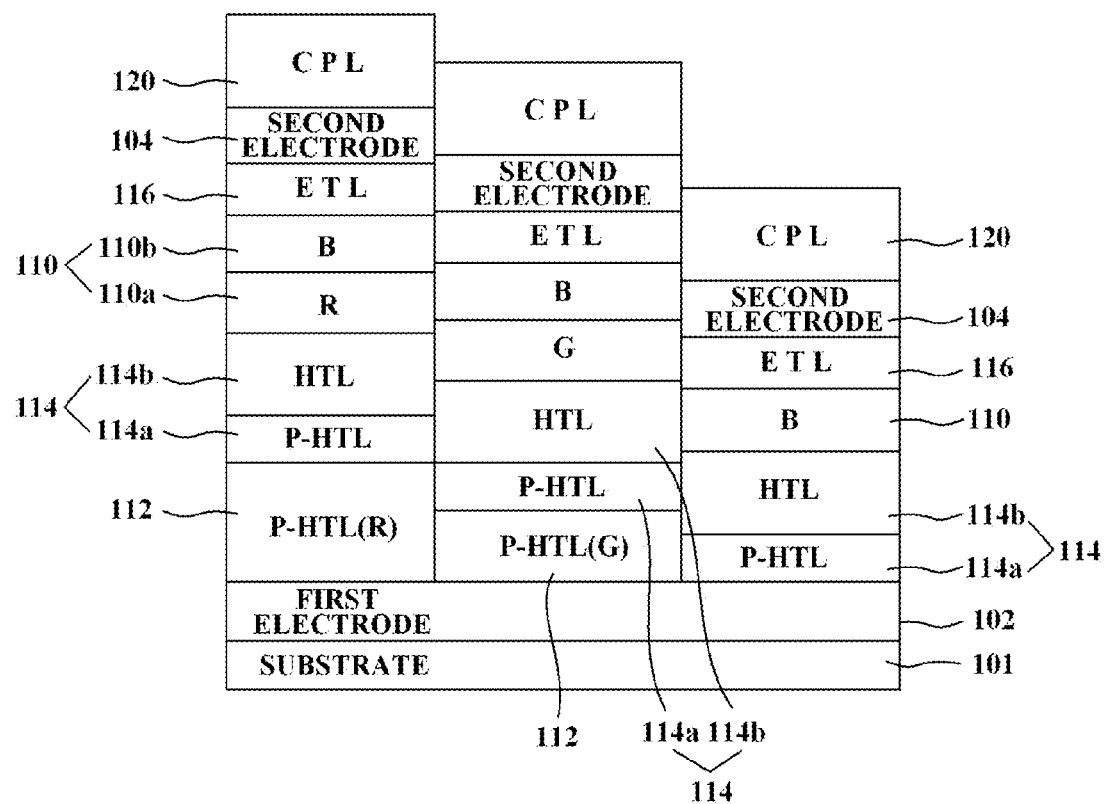
FIG. 10 is a sectional view showing another form of the organic light emitting display device according to the fourth embodiment.

FIGS. 9 and 10 are sectional views showing an organic light emitting display device according to a fourth embodiment of the present disclosure. The organic light emitting display device shown in FIGS. 9 and 10 are identical in construction to those shown in FIGS. 5 and 8 except that red, green, and blue sub-pixels in common have blue emission layers having the same thickness and, therefore, a detailed description of the same components will be omitted.

The red (R) sub-pixel shown in FIGS. 9 and 10 includes a red emission layer 110a and a blue emission layer 110b sequentially stacked on a second hole transporting layer 114b of a common hole transporting layer 114. In this case, short-wavelength blue light generated from the blue emission layer 110b is absorbed by long-wavelength red light generated from the red emission layer 110a. Consequently, the red sub-pixel embodies red (R) without being mixed with blue light.

The green (G) sub-pixel shown in FIGS. 9 and 10 includes a green (G) emission layer 110a and a blue emission layer 110b sequentially stacked on a second hole transporting layer 114b of a common hole transporting layer 114. In this case, short-wavelength blue light generated from the blue emission layer 110b is absorbed by long-wavelength green light generated from the green (G) emission layer 110a. Consequently, the green sub-pixel embodies green (G) without being mixed with blue light.

At this time, the red emission layer 110a of the red (R) sub-pixel is formed such that the thickness of the red emission layer 110a of the red (R) sub-pixel is greater than that of the green emission layer 110a of the green (G) sub-pixel. Consequently, the total thickness of the red (R) sub-pixel is the largest, the total thickness of the green (G) sub-pixel is intermediate, and the total thickness of the blue (B) sub-pixel is the smallest. In the organic light emitting display device according to the fourth embodiment of the present disclosure, therefore, the total thicknesses of the red (R), green (G), and blue (B) sub-pixels are adjusted using the optical adjustment layer 112, the red (R) emission layer 110a, and the green (G) emission layer 110a to constructively interfere with exit light, thereby optimizing vertical efficiency at each sub-pixel.

Table 4 illustrates electro-optic characteristics of red sub-pixels of a comparative example and an example according to the fourth embodiment of the present disclosure.

TABLE 4

| Structure | Volt | cd/A | lm/W | CIEx | CIEy |
| --- | --- | --- | --- | --- | --- |
| Comparative example | 4.9 | 55.1 | 35.7 | 0.662 | 0.335 |
| Example (7%) | 4.4 | 55.8 | 39.6 | 0.660 | 0.338 |

In Table 4, the comparative example and the example are devices having the following stacked structures.

Figure 11A:
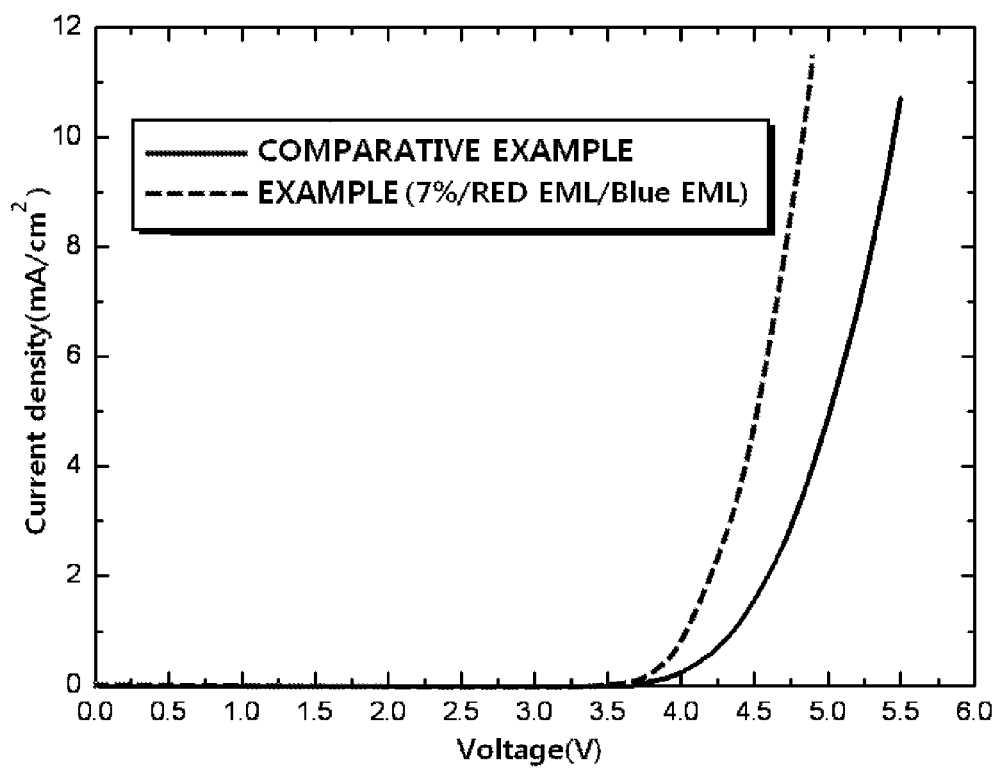
FIGS. 11A and 11B are views illustrating voltage and lifespan characteristics of a red sub-pixel of the organic light emitting display device shown in FIG. 9 and a red sub-pixel of a comparative example.
Figure 11B:
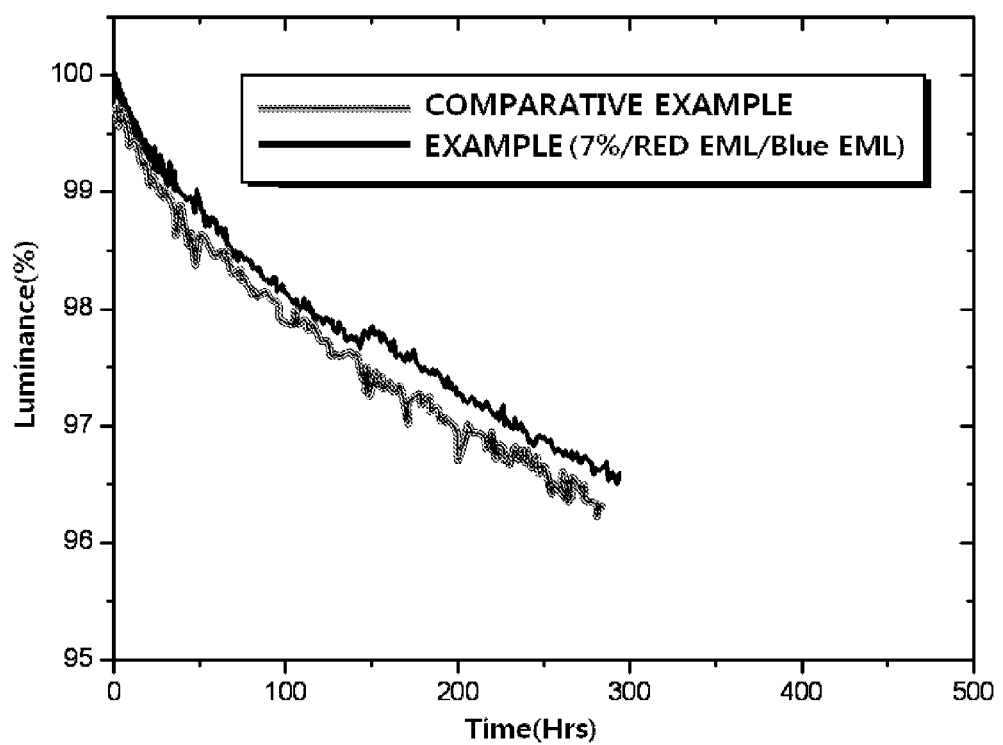

Comparative example: a hole transporting layer (100 Å) doped with a 3% p-type dopant/hole transporting layer (1900 Å)/red emission layer/blue emission layer/electron transporting layer/second electrode/capping layer Example (7%): a first optical adjustment layer (100 Å) doped with a 7% p-type dopant/second optical adjustment layer (700 Å)/first hole transporting layer (100 Å) doped with a 3% p-type dopant/second hole transporting layer (1100 Å)/red emission layer/blue emission layer/ electron transporting layer/second electrode/capping layer As shown in Table 4 and FIG. 11A, it can be seen that the example in which the first optical adjustment layer 112a of the optical adjustment layer 112 of the red sub-pixel is doped with the 7% p-type dopant has maximally 0.5V lower driving voltage to generate the same current density than the comparative example. In addition, as shown in FIG. 11B, it can be seen that lifespan of the example is somewhat increased.

Table 5 illustrates electro-optic characteristics of green sub-pixels of a comparative example and an example.

TABLE 5

| Structure | Volt | cd/A | lm/W | CIEx | CIEy |
| --- | --- | --- | --- | --- | --- |
| Comparative example | 5.1 | 53.6 | 33.0 | 0.268 | 0.705 |
| Example (5%) | 4.6 | 54.9 | 37.6 | 0.271 | 0.703 |

In Table 5, the comparative example and the example are devices having the following stacked structures.

Figure 12A:
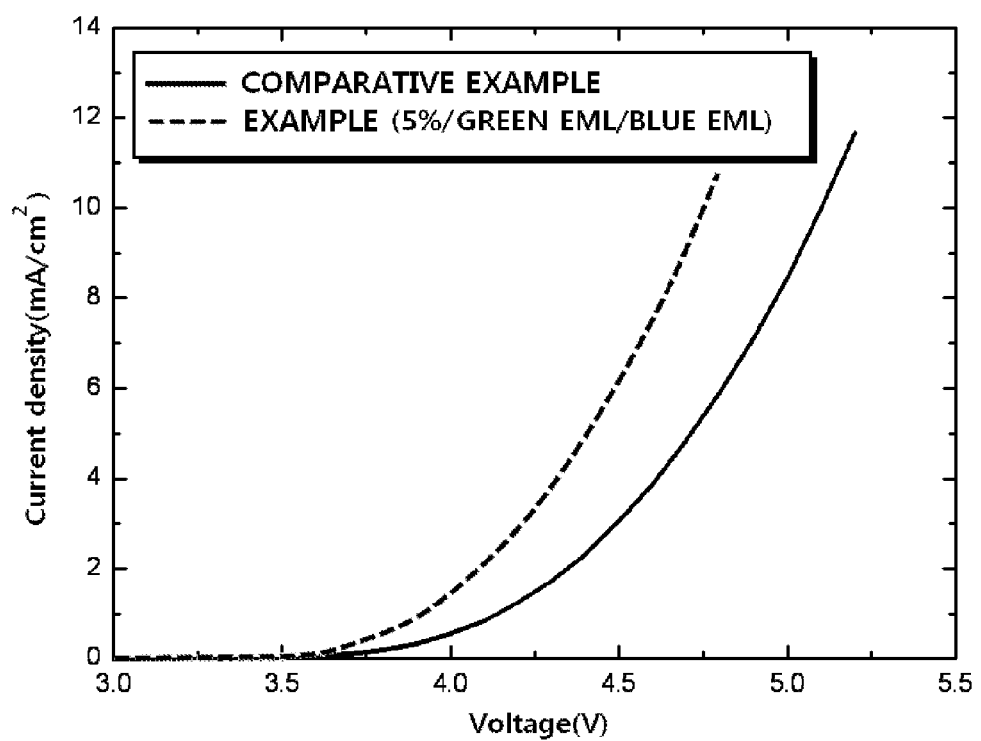
FIGS. 12A and 12B are views illustrating voltage and lifespan characteristics of a green sub-pixel of the organic light emitting display device shown in FIG. 9 and a green sub-pixel of the comparative example.
Figure 12B:
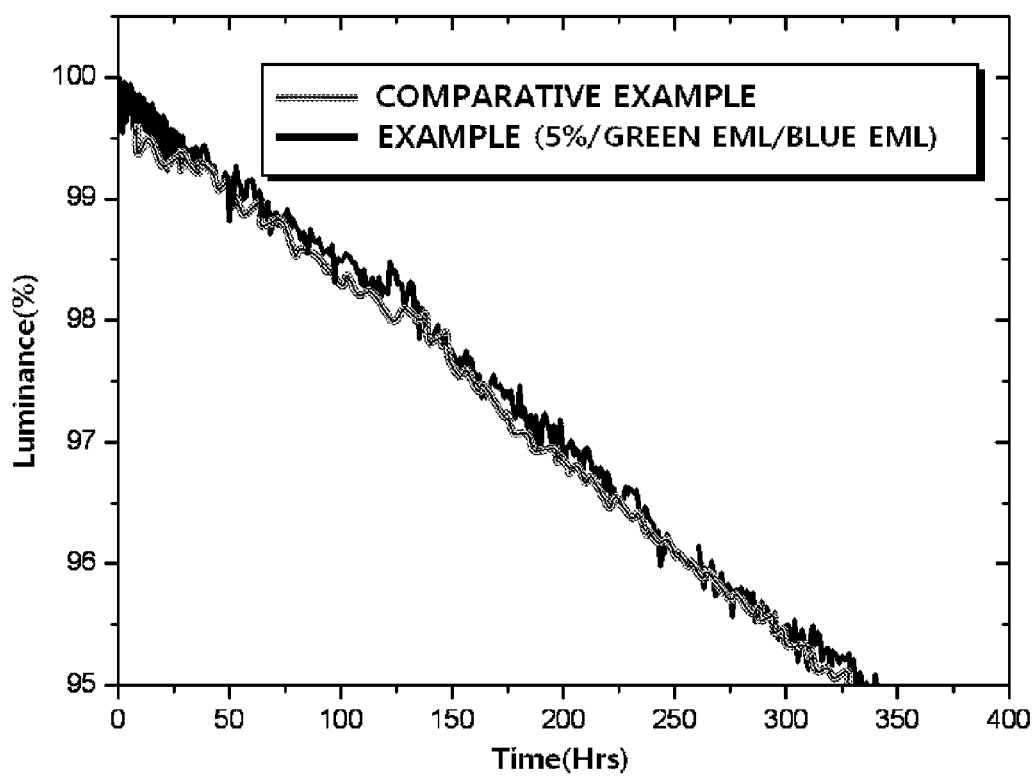

Comparative example: a hole transporting layer (100 Å) doped with a 3% p-type dopant/hole transporting layer (1900 Å)/green emission layer/blue emission layer/electron transporting layer/second electrode/capping layer Example (5%): a first optical adjustment layer (100 Å) doped with a 5% p-type dopant/second optical adjustment layer (700 Å)/first hole transporting layer (100 Å) doped with a 3% p-type dopant/second hole transporting layer (1100 Å)/green emission layer/blue emission layer/electron transporting layer/second electrode/capping layer As shown in Table 5 and FIG. 12A, it can be seen that the example in which the first optical adjustment layer 112a of the optical adjustment layer 112 of the green sub-pixel is doped with the 5% p-type dopant has maximally 0.5V lower driving voltage to generate the same current density than the comparative example. In addition, as shown in FIG. 12B, it can be seen that lifespan of the example is equal to that of the comparative example.

FIGS. 13A to 13F are sectional views illustrating a method of fabricating an organic light emitting display device according to the present disclosure. Hereinafter, a method of fabricating the organic light emitting display device shown in FIG. 5 will be described by way of example.

First, a metal layer and a transparent layer are sequentially deposited on a substrate 101 and the metal layer and the transparent layer are patterned by photolithography and etching to form a first electrode 102. The first electrode 102 is formed to have a multi-layered structure including a metal layer formed of aluminum (Al) or an aluminum alloy, such as AlNd, and a transparent layer formed of indium tin oxide (ITO) or indium zinc oxide (IZO).

Subsequently, an optical adjustment layer 112 and a common hole transporting layer 114 are sequentially formed on the substrate 101, on which the first electrode 102 is formed.

Figure 13A:
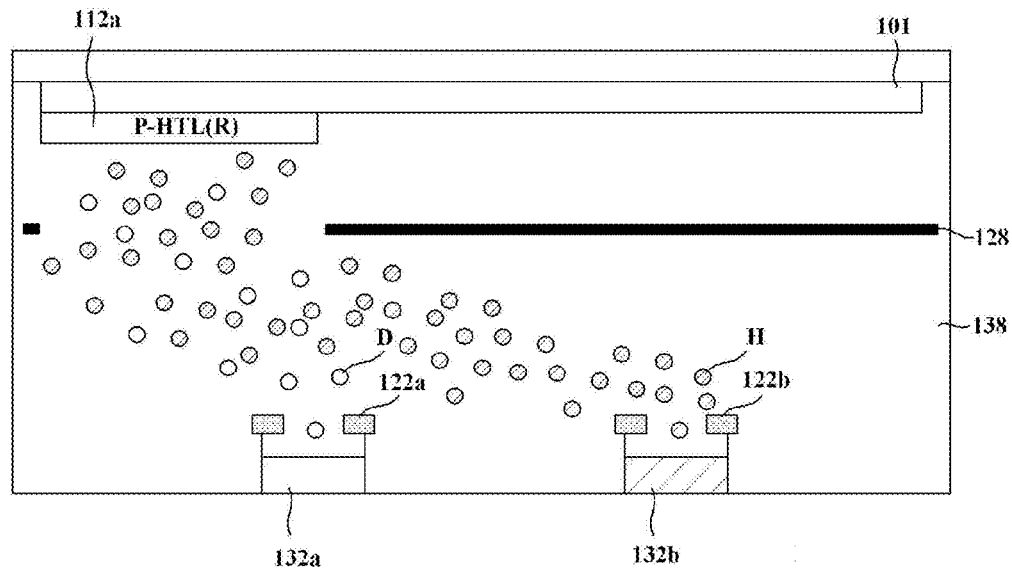
FIGS. 13A to 13F are sectional views illustrating a method of forming a hole transporting layer of the organic light emitting display device shown in FIG. 5.

Specifically, as shown in FIG. 13A, a first evaporation source 132a containing a p-type dopant D and a second evaporation source 132b containing a hole host H are provided in a vacuum chamber 138. In addition, shutters 122a and 122b are formed at the first and second evaporation sources 132a and 132b, respectively.

The substrate 101, on which the first electrode 102 is formed, is located in the vacuum chamber 138. Subsequently, the shutters 122a and 122b of the first and second evaporation sources 132a and 132b are opened. The p-type dopant D and the hole host H evaporated from the first and second evaporation sources 132a and 132b are deposited on the substrate 101 through an opening of a shadow mask 128 to form a first optical adjustment layer 112a of an optical adjustment layer 112 of a red (R) sub-pixel.

Figure 13B:
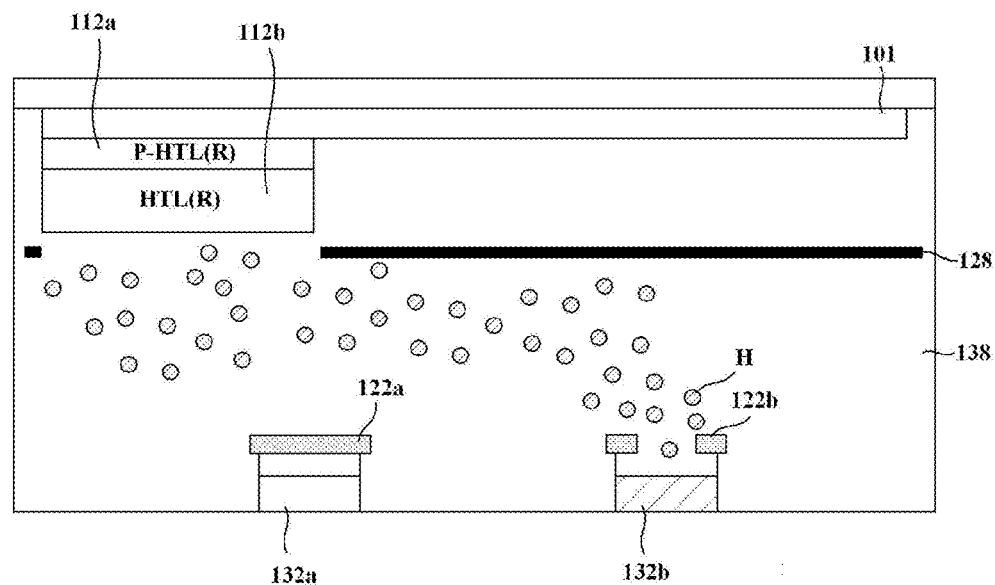

Subsequently, as shown in FIG. 13B, the shutter 122a of the first evaporation source 132a is closed and the shutter 122b of the second evaporation source 132b is opened. The hole host H evaporated from the second evaporation source 132b is deposited on the first optical adjustment layer 112a of the red (R) sub-pixel through the opening of the shadow mask 128 to form a second optical adjustment layer 112b.

Figure 13C:
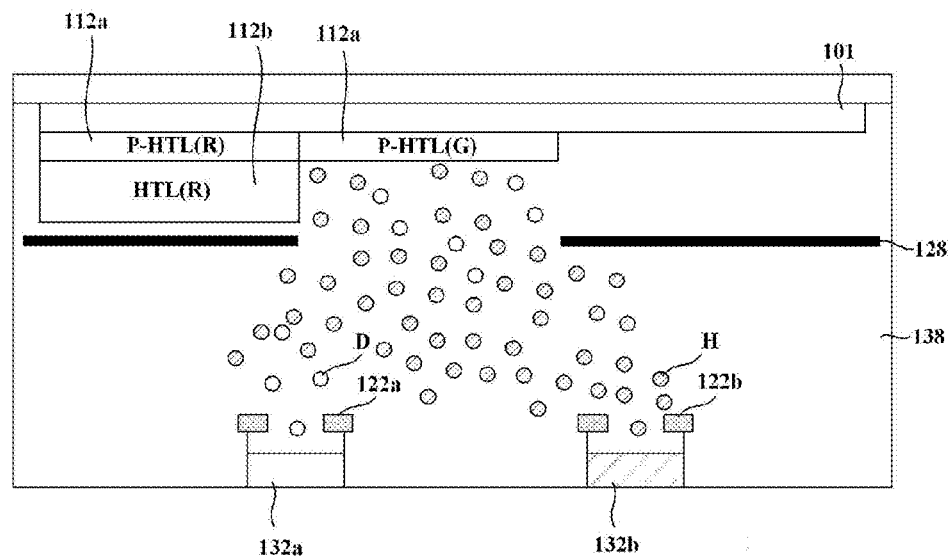

Subsequently, as shown in FIG. 13C, the shutters 122a and 122b of the first and second evaporation sources 132a and 132b are opened. The p-type dopant D and the hole host H evaporated from the first and second evaporation sources 132a and 132b are deposited on the substrate 101 through the opening of the shadow mask 128 to form a first optical adjustment layer 112a of a green (G) sub-pixel. At this time, doping concentration of the p-type dopant doped in the first optical adjustment layer 112a of the green (G) sub-pixel is lower than that of the p-type dopant doped in the first optical adjustment layer 112a of the red (R) sub-pixel.

Figure 13D:
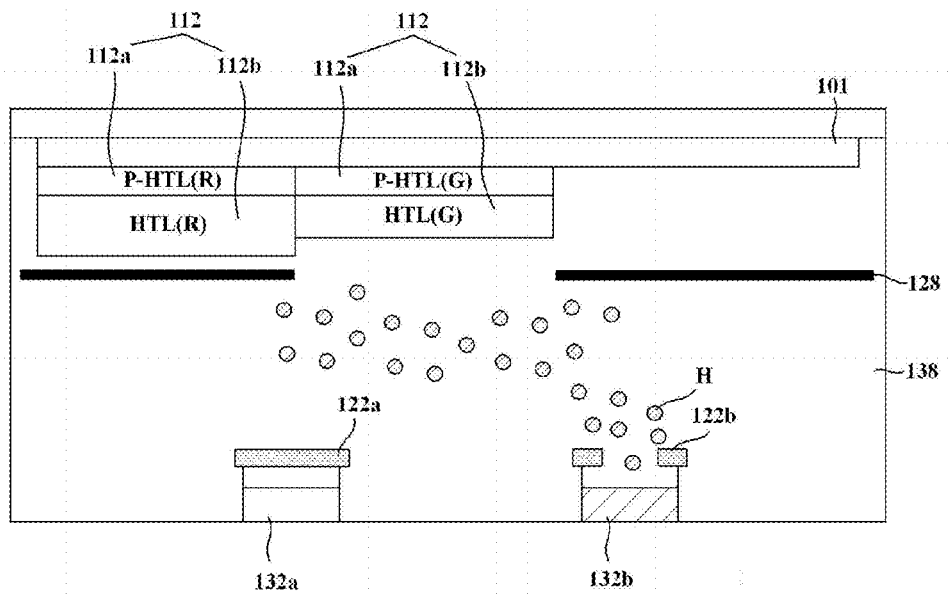

Subsequently, as shown in FIG. 13D, the shutter 122a of the first evaporation source 132a is closed and the shutter 122b of the second evaporation source 132b is opened. The hole host H evaporated from the second evaporation source 132b is deposited on the first optical adjustment layer 112a of the green (G) sub-pixel through the opening of the shadow mask 128 to form a second optical adjustment layer 112b of the green (G) sub-pixel.

At this time, the second optical adjustment layer 112b of the green (G) sub-pixel is formed such that the thickness of the second optical adjustment layer 112b of the green (G) sub-pixel is less than that of the second optical adjustment layer 112b of the optical adjustment layer 112 of the red (R) sub-pixel.

Figure 13E:
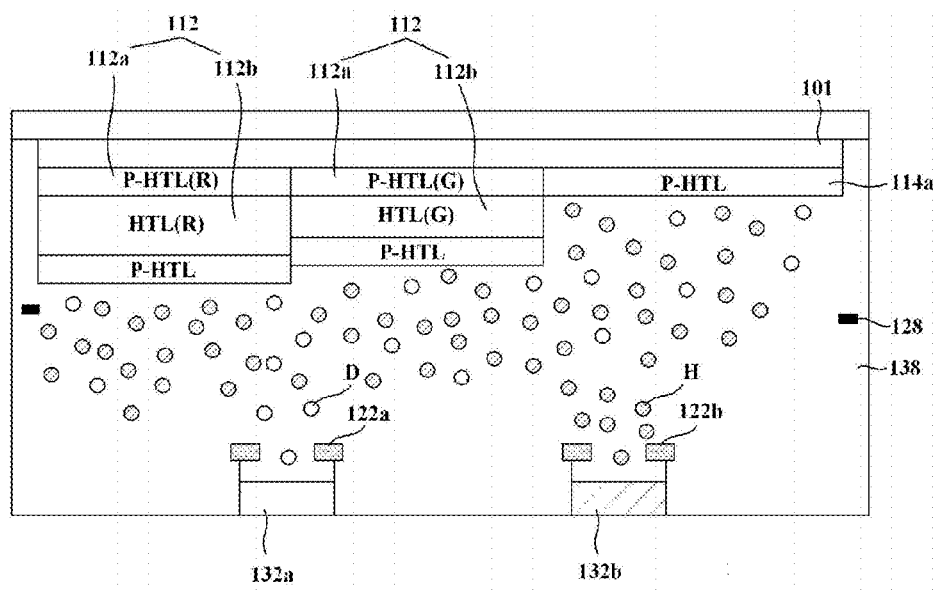

Subsequently, as shown in FIG. 13E, the shutters 122a and 122b of the first and second evaporation sources 132a and 132b are opened. The p-type dopant D and the hole host H evaporated from the first and second evaporation sources 132a and 132b are deposited on the substrate 101 through the opening of the shadow mask 128 to form first hole transporting layers 114a of common hole transporting layers 114 of the red (R) sub-pixel, the green (G) sub-pixel, and a blue (B) sub-pixel.

Figure 13F:
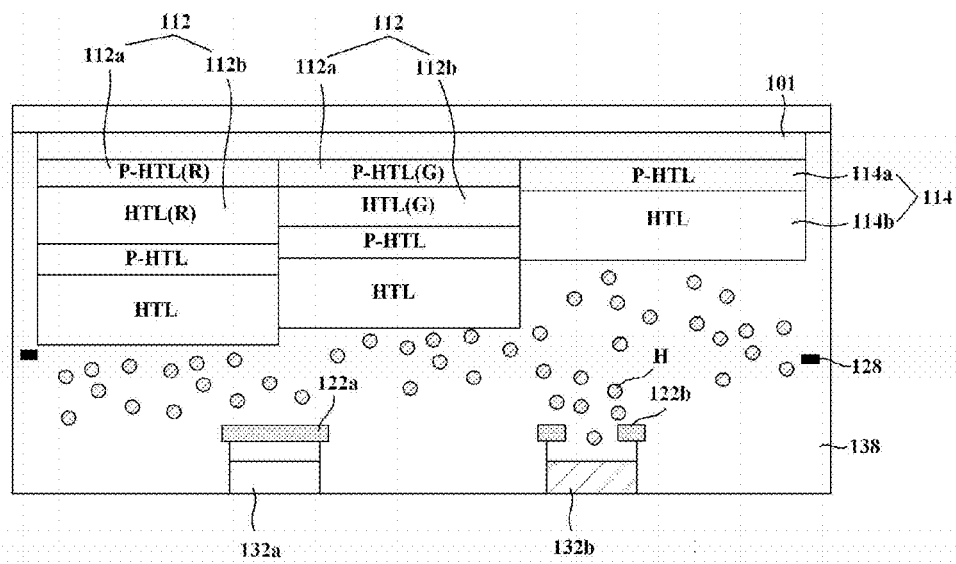

Subsequently, as shown in FIG. 13F, the shutter 122a of the first evaporation source 132a is closed and the shutter 122b of the second evaporation source 132b is opened. The hole host H evaporated from the second evaporation source 132b is deposited on the first hole transporting layers 114a of the common hole transporting layers 114 through the opening of the shadow mask 128 to form second hole transporting layers 114b of the common hole transporting layers 114 of the red (R), green (G), and blue (B) sub-pixels. In FIGS. 13A to 13F, the hole host and the p-type dopant deposited on the optical adjustment layers 112 and the common hole transporting layers 114 are formed of the same material and, therefore, the first and second evaporation sources 132a and 132b are provided. In a case in which the hole host and the p-type dopant are formed of different materials, however, additional evaporation sources are needed.

Subsequently, red (R), green (G), and blue (B) emission layers 110 are sequentially formed on the substrate 101, on which the optical adjustment layers 112 and the common hole transporting layers 114 are formed. Electron transporting layers 116 are formed on the substrate 101, on which the red (R), green (G), and blue (B) emission layers 110 are formed. Second electrodes 104 and capping layers 120 are sequentially formed on the substrate 101, on which the electron transporting layers 116 are formed. Each second electrode 104 is formed of a metal, an inorganic substance, a mixture of metals, a mixture of a metal and an inorganic substance, or a mixture thereof. Each second electrode 104 is formed as a semi-transparent electrode.

As is apparent from the above description, the organic light emitting display device according to the present disclosure is configured such that at least two layers of the multi-layered hole transporting layer are formed as hole transporting layers doped with the p-type dopant. In the organic light emitting display device according to the present disclosure, therefore, power consumption is reduced and lifespan and efficiency characteristics are improved.

It will be apparent to those skilled in the art that various modifications and variations can be made in the present disclosure without departing from the spirit or scope of the disclosure. Thus, it is intended that the present disclosure covers the modifications and variations of the embodiments provided they come within the scope of the appended claims and their equivalents.

What is claimed is:

1. An organic light emitting display device comprising a first sub-pixel, a second sub-pixel, and a third sub-pixel for emitting different colored light, each of the sub-pixels comprising:
    an anode and a cathode on a substrate configured to face each other;
    an emission layer between the anode and the cathode;
    a multi-layered hole transporting layer between, and in contact with, the anode and the emission layer; and
    an electron transporting layer between the cathode and the emission layer,
    wherein the multi-layered hole transporting layer of at least one of the first sub-pixel, the second sub-pixel and the third sub-pixel comprises:
        a first hole transporting layer, wherein the first hole transporting layer is of at least two materials, the at least two materials including a hole host and a p-type dopant having a doping concentration of 1 vol. % to 10 vol. %; and
        a second hole transporting layer formed of the hole host, wherein the second hole transporting layer is over the first hole transporting layer and is farther from the anode than the first hole transporting layer is from the anode, and has a doping concentration less than the doping concentration of the first hole transporting layer, and
        wherein the first hole transporting layer comprising the p-type dopant occupies 10 vol. % to 25 vol. % in the multi-layered hole transporting layer.

2. The organic light emitting display device according to claim 1, wherein:
    the first sub-pixel is a red sub-pixel configured to emit red light through a red emission layer;
    the second sub-pixel is a green sub-pixel configured to emit green light through a green emission layer; and
    the third sub-pixel is a blue sub-pixel configured to emit blue light through a blue emission layer,
    wherein the multi-layered hole transporting layer of each of the red and green sub-pixels comprises:
        a common hole transporting layer formed by sequentially stacking the first hole transporting layer and the second hole transporting layer; and
        an optical adjustment layer between the common hole transporting layer and the anode, and
    wherein the multi-layered hole transporting layer of the blue sub-pixel comprises a common hole transporting layer formed by sequentially stacking the first hole transporting layer and the second hole transporting layer.

3. The organic light emitting display device according to claim 2, wherein:
    the red, green, and blue sub-pixels in common comprise blue emission layers;
    the blue emission layer of the red sub-pixel is between the red emission layer and the electron transporting layer; and
    the blue emission layer of the green sub-pixel is between the green emission layer and the electron transporting layer.

4. The organic light emitting display device according to claim 2, wherein:
    the optical adjustment layer comprises a first optical adjustment layer and a second optical adjustment layer between the anode and the common hole transporting layer, wherein:
    the first optical adjustment layer is formed of a hole host and a p-type dopant identical to or different from that of the first hole transporting layer; and
    the second optical adjustment layer is formed of a hole host identical to or different from that of the second hole transporting layer, and is farther from the anode than the first optical adjustment layer is from the anode.

5. The organic light emitting display device according to claim 4, wherein the first optical adjustment layer of the red sub-pixel has a larger thickness than the first optical adjustment layer of the green sub-pixel.

6. The organic light emitting display device according to claim 4, wherein the first optical adjustment layer and the first hole transporting layer comprising the p-type dopant occupy 10 vol. % to 25 vol. % in the multi-layered hole transporting layer.

7. The organic light emitting display device according to claim 2, wherein:
    the optical adjustment layer comprises a first optical adjustment layer between the anode and the common hole transporting layer; and
    the first optical adjustment layer is formed of a hole host and a p-type dopant identical to or different from that of the first hole transporting layer.

8. The organic light emitting display device according to claim 7, wherein the first optical adjustment layer of the red sub-pixel has a larger thickness than the first optical adjustment layer of the green sub-pixel.

9. The organic light emitting display device according to claim 7, wherein the first optical adjustment layer and the first hole transporting layer comprising the p-type dopant occupy 10 vol. % to 25 vol. % in the multi-layered hole transporting layer.

10. The organic light emitting display device according to claim 1, wherein:
    the p-type dopant is formed of a compound selected from the group consisting of F4-TCNQ, 1,4-TCAQ, 6,3-TCPQ, TCAQ, TCNTHPQ, and TCNPQ; and
    the hole host is formed of a compound selected from the group consisting of NPB, PPD, TPAC, BFA-1T, and TBDB.

11. The organic light emitting display device according to claim 10, wherein the p-type dopant has a lowest unoccupied molecular orbital (LUMO) level less than that of the hole host.

12. A method of fabricating an organic light emitting display device comprising a first sub-pixel, a second sub-pixel, and a third sub-pixel for emitting colored light, the method comprising:
    forming anodes of the first sub-pixel, the second sub-pixel, and the third sub-pixel on a substrate;
    forming multi-layered hole transporting layers on the anodes;
    forming emission layers on the hole transporting layers;

forming electron transporting layers on the emission layers; and forming cathodes on the electron transporting layers, wherein the multi-layered hole transporting layer of at least one of the first sub-pixel, the second sub-pixel, and the third sub-pixel comprises:
- a first hole transporting layer, wherein the first hole transporting layer is of at least two materials, the at least two materials including a hole host and a p-type dopant having a doping concentration of 1 vol. % to 10 vol. %; and
- a second hole transporting layer formed of the hole host, wherein the second hole transporting layer is over the first hole transporting layer and farther from the anode than the first hole transporting layer is from the anode, and has a doping concentration less than the doping concentration of the first hole transporting layer, and
wherein the first hole transporting layer comprising the p-type dopant occupies 10 vol. % to 25 vol. % in the multi-layered hole transporting layer.

13. The method according to claim 12, wherein:
the first sub-pixel is a red sub-pixel configured to emit red light through a red emission layer;
the second sub-pixel is a green sub-pixel configured to emit green light through a green emission layer; and
the third sub-pixel is a blue sub-pixel configured to emit blue light through a blue emission layer;
wherein forming the multi-layered hole transporting layers of the red sub-pixel, the green sub-pixel, and blue sub-pixel comprises:
- forming optical adjustment layers on the anodes of the red sub-pixel and the green sub-pixel; and
- forming common hole transporting layers each comprising the first and second hole transporting layers on the optical adjustment layers of the red and green sub-pixels and on the anode of the blue sub-pixel; and
- at least one of the optical adjustment layers, first hole transporting layers, and second hole transporting layers is formed by scanning or deposition using a shutter.

14. The method according to claim 13, wherein
forming each optical adjustment layer comprises sequentially forming a first optical adjustment layer and a second optical adjustment layer between the anode and the common hole transporting layer, wherein:
the first optical adjustment layer is formed of a hole host and a p-type dopant identical to or different from that of the first hole transporting layer; and
the second optical adjustment layer is formed of a hole host identical to or different from that of the second hole transporting layer, and is farther from the anode than the first optical adjustment layer is from the anode.

15. The method according to claim 14, wherein the first optical adjustment layer of a red sub-pixel has a larger thickness than the first optical adjustment layer of a green sub-pixel.

16. The method according to claim 13, wherein:
forming each optical adjustment layer comprises forming a first optical adjustment layer between the anode and the common hole transporting layer; and
the first optical adjustment layer is formed of a hole host and a p-type dopant identical to or different from that of the first hole transporting layer.

17. The method according to claim 16, wherein the first optical adjustment layer of the red sub-pixel has a larger thickness than the first optical adjustment layer of the green sub-pixel.

18. The method according to claim 12, wherein:
the p-type dopant is formed of a compound selected from the group consisting of F4-TCNQ, 1,4-TCAQ, 6,3-TCPQ, TCAQ, TCNTHPQ, and TCNPQ; and
the hole host is formed of a compound selected from the group consisting of NPB, PPD, TPAC, BFA-1T, and TBDB.

19. An organic light emitting display device comprising a first sub-pixel, a second sub-pixel, and a third sub-pixel for emitting different colored light, each of the sub-pixels comprising:
an anode and a cathode on a substrate configured to face each other;
an emission layer formed between the anode and the cathode;
a multi-layered hole transporting layer formed between, and in contact with, the anode and the emission layer; and
an electron transporting layer formed between the cathode and the emission layer,
wherein the multi-layered hole transporting layer of at least one of the first sub-pixel, the second sub-pixel and the third sub-pixel comprises:
- a first hole transporting layer, wherein the first hole transporting layer is of at least two materials, the two materials including a hole host and a p-type dopant having a doping concentration of 1 vol. % to 10 vol. %; and
- a second hole transporting layer formed of the hole host, wherein the second hole transporting layer is over the first hole transporting layer and farther from the anode than the first hole transporting layer is from the anode, and has a doping concentration of 0 vol. %, and
wherein the first hole transporting layer comprising the p-type dopant occupies 10 vol. % to 25 vol. % in the multi-layered hole transporting layer.

* * * * *